United States Patent
Biber et al.

(10) Patent No.: US 11,611,230 B2
(45) Date of Patent: Mar. 21, 2023

(54) POWER SUPPLY FACILITY FOR A MAGNETIC RESONANCE FACILITY, MAGNETIC RESONANCE SYSTEM, AND METHOD FOR OPERATING A POWER SUPPLY FACILITY

(71) Applicant: Siemens Healthcare GmbH, Erlangen (DE)

(72) Inventors: Stephan Biber, Erlangen (DE); Sören Grübel, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/406,036

(22) Filed: Aug. 18, 2021

(65) Prior Publication Data

US 2022/0060046 A1    Feb. 24, 2022

(30) Foreign Application Priority Data

Aug. 19, 2020   (DE) .................. 10 2020 210 504

(51) Int. Cl.
*G01R 33/36* (2006.01)
*H02J 9/06* (2006.01)
*G01R 33/3815* (2006.01)

(52) U.S. Cl.
CPC ............ *H02J 9/06* (2013.01); *G01R 33/36* (2013.01); *G01R 33/3815* (2013.01)

(58) Field of Classification Search
CPC . H02J 9/06; H02J 3/32; H02J 2310/12; G01R 33/36; G01R 33/3815; G01R 33/3614; G01R 33/3852; G01R 33/543; G01R 33/28
See application file for complete search history.

(56) References Cited

U.S. PATENT DOCUMENTS

| | | |
|---|---|---|
| 2010/0220837 A1 | 9/2010 | Bressel |
| 2011/0210739 A1 | 9/2011 | Ham |
| 2014/0070809 A1 | 3/2014 | Imamura et al. |
| 2014/0070812 A1* | 3/2014 | Yokoi .................. G01R 33/48 324/322 |
| 2018/0224512 A1* | 8/2018 | Poole ................ G01R 33/3858 |

FOREIGN PATENT DOCUMENTS

DE       102009010219 A1    9/2010

OTHER PUBLICATIONS

German Office Action for German Application No. 10 2020 210 504.9 dated Jul. 9, 2021.

* cited by examiner

*Primary Examiner* — G. M. A. Hyder

(74) *Attorney, Agent, or Firm* — Lempia Summerfield Katz LLC

(57) ABSTRACT

A power supply facility for supplying a magnetic resonance facility with electrical power includes a control facility, a network connection to a power network, and an electrical energy store, such as a battery. The network connection is configured for an installed power level that is lower than a maximum power level that may be demanded by the magnetic resonance facility. The control facility is configured, in the event that a power demand of the magnetic resonance facility exceeds the installed power, to provide the power from the network connection and the energy store.

19 Claims, 3 Drawing Sheets

POWER SUPPLY FACILITY FOR A MAGNETIC RESONANCE FACILITY, MAGNETIC RESONANCE SYSTEM, AND METHOD FOR OPERATING A POWER SUPPLY FACILITY

This application claims the benefit of German Patent Application Number 10 2020 210 504.9, filed on Aug. 19, 2020, which is hereby incorporated by reference in its entirety.

BACKGROUND

The present embodiments relate to a power supply facility for supplying a magnetic resonance facility with electrical power, a magnetic resonance system, and a method for operating a power supply facility.

Magnetic resonance facilities use strong magnetic fields generated by magnets for, for example, medical imaging. Therein, magnetic resonance facilities with a superconducting, helium-cooled main magnet are known, and, for example, in the low field domain of less than 1.5 T (e.g., less than or equal to 0.25 T), "dry" main magnets have been proposed that operate without helium cooling and therefore use a conventional cooling facility. Apart from the cooling for the main magnets, in a magnetic resonance facility, a relatively large power output is needed for the gradient system. The gradient system typically includes gradient amplifiers and the gradient coil arrangement since strong, rapidly changing gradient fields are to be generated thereby. The gradient fields are intended to impress local changes onto the main magnetic field generated by the main magnet. Also to be considered as electrical consumers are, for example, the radio frequency system (e.g., transmitter system) with which radio frequency pulses of a magnetic resonance sequence are output, as well as cooling facilities for various other components of the magnetic resonance facility (e.g., also the gradient system and the transmitter system).

Installations of magnetic resonance facilities present challenges at the premises of a user, in principle, due to the installation space required, the weight, the strong magnetic fields, the screening requirement, and also the electrical power requirements. With regard, for example, to the installed power (e.g., the power to be made available by a network connection), modern magnetic resonance facilities require, for example, between 30 and 300 kVA. With regard to relatively economical magnetic resonance facilities and/or for users to whom high power output consumer-side network connections are not available, difficulties may arise in this regard.

Nowadays, magnetic resonance facilities are configured with respect to installed power (e.g., the input power needed by the network connection), so that a maximum power output required is gauged. This takes place in that the most power-intensive usage variant is determined and the gauging is carried out accordingly. This most power-intensive usage variant, and therefore the scan protocol that demands the highest power output (e.g., maximum power) may be, for example, a diffusion scan using echo-planar imaging (EPI). The maximum power required by the magnetic resonance facility ascertained therein is then passed on as a requirement placed on the infrastructure and thus on the installed power. It is therein usually not possible, due to the complexity, to take account of individual uses of the magnetic resonance facility at specific customers.

It is known, however, to assign to magnetic resonance facilities an uninterruptible power supply (UPS) facility that enables the continued operation of the magnetic resonance facility even during a power failure, and thus a failure of the power network, to which the magnetic resonance facility is connected using the network connection. Such UPS facilities are configured so that the overall magnetic resonance facility may be operated therewith at a maximum power demandable.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved power installation concept for magnetic resonance facilities is provided.

In a power supply facility of the type mentioned in the introduction, it is provided, according to the present embodiments, that the network connection is configured for an installed power level that is lower than a maximum power level that may be demanded by the magnetic resonance facility. The control facility is configured, in the event that a power demand of the magnetic resonance facility exceeds the installed power, to provide the power from the network connection and the energy store.

Therein, the control facility is naturally also suitably configured for charging the energy store from the power network when the power demand of the magnetic resonance facility falls below the installed power of the network connection (and the incompletely charged energy store). The network connection and the electrical energy store may suitably be part of an uninterruptible power supply (UPS) facility that is connected via an electric connection to the magnetic resonance facility. In this regard, the control facility may be formed, for example, from a control unit of the UPS facility and a control arrangement of the magnetic resonance facility itself, which communicate accordingly with one another via a communication connection.

The present embodiments may be used for magnetic resonance facilities that have a main magnetic field with a strength of less than 1.5 T (e.g., less than or equal to 0.35 T), and/or a corresponding main magnet is cooled without (e.g., as a dry magnet) or with only little (e.g., a reduced quantity of) helium. In this way, the present embodiments solve, for example, the question of how, from demands that new helium-free/low-helium magnetic resonance facilities place on the infrastructure, synergies may come about with a reduction of the installed power.

According to the present embodiments, the installed power of the network connection (e.g., the input power accessible via the network connection) is configured to be lower than the maximum power that may be demanded by the magnetic resonance facility during power-intensive operation. Therein, using the control facility, the magnetic resonance facility is always supplied as usual from the network connection, provided the power level demanded by the magnetic resonance facility (e.g., power demand of the magnetic resonance facility) is lower than or equal to the installed power. If, however, the power demand rises above the installed power, the control facility is configured to provide lacking electrical power from the energy store (e.g., a battery of a UPS facility). This provides that in the case of scan protocols with a high power demand, for example, a diffusion scan with echo-planar imaging (EPI), a time-offlight (TOF) scan, and/or a scan using the HASTE sequence, the control facility and the energy store (e.g., the interposed UPS facility) may provide the additional power lacking in relation to the installed power from the energy store and may therefore enhance the installed electrical power at the user. Therein, the configuration of the power supply facility may be, for example, such that power-intensive scan protocols may be used, depending upon the storage capacity of the energy store, for example, for 5 to 60 minutes without the need to provide a higher installed power level. In view of the fact that, for example, typical diffusion-EPI scans, including in the low field domain, take only approximately 3 to 8 minutes, it is realistically conceivable and economic in the long term to cover the peak power requirement from the energy store (e.g., an energy store of a UPS facility), rather than making the maximum power permanently available in the installation.

In other words, this provides that an installation possibility is created for magnetic resonance systems that, particularly with the aid of a UPS facility, may carry out power-intensive scan protocols for restricted durations, although the supply from the power network is configured for lower installed power levels. In other words, a departure is made from the previous run once, run ever (RORE) principle pursued in the prior art, as far as the scan protocols is concerned, in order to provide a lower installed power by suitable design of the power supply facility, but nevertheless to provide for the use, for a minimum period, of more power-intensive scan protocols. In this way, costs for the user-side infrastructure and running costs may be saved through the reduction of the installed power. In the case of the use of a UPS facility, it may be put to multiple use (e.g., first, the power supply to the magnetic resonance facility in the event of a failure of the power network, and second, support during relatively power-intensive use).

In one embodiment, it may be provided, for example, that the installed power of the network connection is 50% to 90 (e.g., 60% to 80%) of the maximum power demandable by the magnetic resonance facility. This may come about, for example, or in an alternative selection, in that the installed power of the network connection is selected as a statistical mean power demand of the magnetic resonance facility in image recording operation, dependent upon this mean power demand, or as a maximum power demand of a reference group of scan protocols, and/or magnetic resonance sequences categorized as less power-intensive. For example, therefore, from operating data of the magnetic resonance facility established during the use of already installed magnetic resonance systems and/or in dedicated test scans, a basis for determining a practically useful installed power may be established. This may achieve a useful balance between charging operation for the energy store in order to be able to provide as much energy as often as possible for the power-intensive scan protocols, and discharging operation of the energy store during these power-intensive scan protocols.

For example, a reference group of scan protocols categorized as less power-intensive may be created, whereby a reference group of very power-intensive scan protocols then also comes into being. If a "worst case scenario" is considered for both of these reference groups, and thus the respectively demandable maximum power levels for the reference groups, the installed power may be selected as the maximum power demandable within the reference group of scan protocols and/or magnetic resonance sequences categorized as less power-intensive. For example, it may be specified that the maximum power demand of the reference group of scan protocols and/or magnetic resonance sequences categorized as less power-intensive is established with a scan of the head of a patient, whereas the maximum power demandable overall by the magnetic resonance facility may relate, for example, to echo-planar (EPI) diffusion scans.

The storage capacity of the energy store may be selected, for example, such that at least the component of the energy storage capacity provided for the support of power-intensive use is sufficient to be able to maintain the maximum power and/or a maximum mean power demanded by the power-intensive scan protocol for a particular time period (e.g., 5 to 60 minutes). If, as considered in greater detail below, energy buffers are to be provided for other purposes (e.g., during power failures), space is naturally to be provided therefore in the storage capacity. For example, it has been shown that a storage capacity of the energy store of at least 5 kWh (e.g., at least 10 kWh), which is common for UPS facilities obtainable on the market, may itself be sufficient to support the power-intensive usage that exceeds the installed power, for sufficiently long, and additionally to provide space for the aforementioned additional energy buffers/energy accounts.

The design principles presented here are naturally only to be regarded as exemplary, and in another embodiment, the installed power may be, for example, selected as a mean value of the power demand of the reference group of scan protocols and/or magnetic resonance sequences categorized as less power-intensive and/or as a general mean value of the demanded power levels of the magnetic resonance facility and/or further to extend the mean value by a safety factor (e.g., 20% in order to determine the installed power).

The output power accessible from the energy store is to be dimensioned accordingly in order to be able to provide the maximum power for the magnetic resonance facility. In this way, in the case of a series connection, the difference between the maximum power demandable by the magnetic resonance facility and the installed power may be provided from the energy store together with the installed power.

Although the energy store may suitably be formed by a battery of a UPS facility, it is, however, also possible additionally or alternatively to use other energy stores. It may thus be provided, for example, that the or at least one energy store of the plurality of energy stores is an energy store that is chargeable faster than a battery. Thus, for example, the power supply facility may have a supercapacitor and/or a flywheel as an energy store in order to be able to provide a large storage capacity again as quickly as possible after a discharge.

As previously mentioned, it may be provided that the storage capacity of the energy store is selected for maintaining at least one operational state of the magnetic resonance facility for at least one predetermined time period. In this regard, the storage capacity may also be subdivided, for example, on more extensive use of the energy store (e.g., during a power failure) and may therefore result as the sum of the maintenance of a plurality of operational states for a plurality of predetermined time periods. For example, the storage capacity of the energy store may be specified such that a scan protocol in which the maximum power demandable by the magnetic resonance facility occurs is executable with the existing network supply for a predetermined time period in the range of 5 to 60 minutes, and/or an emergency cooling is enabled during a power failure for a predetermined time period in the range of 30 to 90 minutes, and/or a general basic operational readiness of the magnetic resonance facility during a power failure for a predetermined time period in the range of 2 to 30 minutes with fully charged energy stores is enabled.

In one embodiment, the control facility may have a control unit associated with the energy store and a control arrangement of the magnetic resonance facility, which are communicatively linked. The control unit is configured, for example, for cyclical transmission to the control facility of an item of charge information including, for example, the current charge state of the energy store. Therein, the control unit may suitably be part of a UPS facility as described above, so that the main energy management and/or power management remains with the control arrangement of the magnetic resonance facility. Therein, minimum information may be considered to be when the energy store is charged or has reached a particular charge state, after which this indicates when the energy store may be used as backup for the network connection. However, in an optimum manner, the specific current charge state of the energy store is known to the control arrangement on behalf of the magnetic resonance facility.

In one embodiment, it may be provided that the control facility is configured, on selection of a scan protocol to be carried out using a magnetic resonance sequence, to predict an energy requirement for the performance of the scan protocol by a power model. The control facility may be further configured to evaluate a feasibility criterion that evaluates the current charge state of the energy store and the predicted energy requirement, and indicates the feasibility of the scan protocol. If non-feasibility is indicated, a notification is output to the user, and the execution of the scan protocol is suppressed. In order to provide, when using the magnetic resonance facility, that when power-intensive scan protocols are used, unexpected scan interruptions do not occur, before the start of the scan protocol, the control facility (e.g., the magnetic resonance facility-side control arrangement) may check, on the basis of the current charge state of the energy store, whether a complete performance of the scan protocol is at all possible. For this purpose, a power model that may at least roughly estimate the energy requirement of the scan protocol is used so that a feasibility criterion that also uses the current charge state of the energy store may be evaluated. Therein, in the simplest embodiment, it may be checked by the feasibility criterion whether the scan protocol runs for a particular scan time (e.g., total scan duration), whether the energy requirement is greater than the installed power multiplied by the scan time plus the charge state of the energy store, in which case the scan protocol would not be executable. More complex configurations of the feasibility criterion may also be provided (e.g., if the predicted energy requirement also contains a power variation in the power level demanded by the magnetic resonance facility and thus possibly current charging phases and/or phases in which in general the power demand falls below the installed power are taken into account). However, the power model as the energy requirement may specify directly the energy requirement from the energy store once the installed power is known to the power model. Then, in the feasibility criterion, suitably only the energy requirement is to be compared with the charge state of the energy store. Herein, if energy buffers are to be kept in readiness for other functions, these are also naturally taken into account accordingly in the feasibility criterion.

In one embodiment, the control facility may be configured, given the existence of a feasibility criterion indicating the feasibility and if a warning condition that indicates a residual charge state falling below a threshold value and/or a restriction of at least one further function to be supplied from the energy store is met, to output a warning indicating this circumstance to the user and, for example, to request a confirmation from the user before the performance of the scan protocol. Alternatively or additionally, the control facility may be configured, in the event of a feasibility criterion indicating the non-feasibility, for establishing and outputting at least one item of additional information (e.g., a waiting time until the feasibility) and/or for establishing, for example, using the power model and using an item of adaptation information for at least one recording parameter of the scan protocol, such that the scan protocol is executable.

If the scan protocol is executable without difficulty (e.g., while maintaining a certain residual charge state of the energy store), an information output to the user of the magnetic resonance facility is not required and the protocol may, as usual, be carried out in this case that is the most frequent given a suitable design of the power supply facility. However, if a warning condition is met (e.g., if the residual charge state is lower than a predetermined threshold value), which may imply restrictions, for example, for subsequent scan protocols or that it is even necessary to restrict at least one further function that is to be supplied from the energy store (e.g., in that a part of an energy buffer/energy reserve is needed), a warning indicating this circumstance may be output to the user. It may be suitable then to request a further confirmation from the user for the actual performance of the scan protocol. It is therefore known to the user that the user has reached the limit of the power supply facility.

If the non-feasibility is established, further support may suitably be made available to the user. For example, an item of additional information with regard to the non-feasibility (e.g., including a waiting time until the feasibility) may be established. It is therefore calculated herein how much time is needed to charge the energy store sufficiently. Another possibility of an item of additional information is an alternative scan protocol, which may be carried out with the electrical energy available in the energy store.

In one embodiment, however, an item of adaptation information that relates to at least one recording parameter of the selected scan protocol is established. Herein, the power model that may roll out the selected scan protocol may be used in order to ascertain by which recording parameters of the scan protocol the energy requirement may be reduced on a modification. For example, an adaptation of the shape of gradient pulses may take place in order to achieve a lower energy and/or power requirement by the gradient system, and/or the transmitting voltage may be reduced and suchlike. For example, recording parameters and/or alternative values for particular recording parameters may already be specified for the power model in order to favor a rapid establishment of the adaptation information. It is also conceivable in this regard, for example, to extend scan pauses in order to provide charging times for the energy store. This type of adaptation of the parameterization is already known in another context, specifically with regard to cooling facilities (e.g., cooling facilities for the gradient system). Herein, as limitations, for example, maximum values for temperatures and the like may be specified so that, for example, in an existing calculation module running in this context, for parameterizing with regard to the cooling, a maximum energy requirement may be introduced as an additional restriction.

In a specific embodiment of the power supply facility, the use of the power model may include the establishment of at least one power requirement value that is associated with the scan protocol to be carried out and/or the magnetic resonance sequence, and/or the prediction of the energy requirement by multiplication of the at least one power requirement value by a scan time of the scan protocol. Therein, by using a plurality of power requirement values, a distribution into different portions may take place, where particular portions may also be the same across a plurality of, or even all, the scan protocols. In specific terms, it may be provided that the at least one power requirement value is selected from a group including a basic requirement value for the operation of the magnetic resonance facility, a gradient requirement value for a gradient system of the magnetic resonance facility, and a radio frequency requirement value for a transmitter system of the magnetic resonance facility. The basic requirement value for the operation of the magnetic resonance facility may be selected to be the same, for example, for all scan protocols and/or magnetic resonance sequences and may be available to the power model accordingly. The gradient requirement value relates to the operation of the gradient system that usually represents a very large proportion of the power requirement and thus also the energy requirement during the performance of a scan protocol and/or a magnetic resonance sequence. Dependent upon the number and strength of the gradient pulses needed, different gradient requirement values may arise herein for different scan protocols and/or magnetic resonance sequences, which otherwise in some magnetic resonance facilities may alone account in the consideration for a substantial proportion and/or a sufficient proportion of the scan protocol-specific and/or magnetic resonance sequence-specific energy requirement. With regard to the radio frequency requirement value, it is the case that this is often significantly lower than the gradient requirement value, so that where relevant, in some embodiments, for simplification of the power model, the radio frequency requirement value may also be neglected.

By way of example, the energy requirement may result as the sum of a basic energy requirement (e.g., basic requirement value×scan time) and the scan time multiplied by the gradient requirement value and the radio frequency requirement value. Simplified, the radio frequency system (e.g., transmitter system) may be ignored or taken into account with a fixed value. The gradient requirement value and the radio frequency requirement value and/or, generally formulated, the gradient energy requirement and the radio frequency energy requirement may be evaluated very exactly in the selection of the corresponding scan protocol, before the scan protocol is started. Different variants may be provided. It is therefore possible that the gradient requirement value and the radio frequency requirement value may be established from an association with the scan protocol and/or the scan protocol type and/or the magnetic resonance sequence and/or the magnetic resonance sequence and/or the magnetic resonance type. For example, a look-up table, in which, for particular scan protocols and/or scan protocol types and/or magnetic resonance sequences and/or magnetic resonance sequence types, respectively associated gradient requirement values and radio frequency requirement values are present, may be used.

In one embodiment, the use of the power model in the context of a predictive projection of at least one partial energy requirement related to at least one component of the magnetic resonance facility (e.g., the gradient system) includes a simulation of at least one part of the scan protocol (e.g., by rolling out the scan protocol, such as for determining the gradient requirement value). For example, the current consumption and therefore the power consumption of the gradient system (e.g., the gradient power amplifier (GPA)) may be simulated within the power model. This may serve to establish a gradient requirement value (e.g., mean), but may also include a complete temporal progression of the power demanded by the gradient system. In one example, the energy requirement of the magnetic resonance facility may then be estimated from a thus established demanded power of the gradient system plus an offset for the remaining components, where the offset may be established, for example, from corresponding power requirement values in combination with the scan time, and the energy requirement of the gradient system, for example, by integration of a progression of the demanded power over the scan time. Also, in general, with regard to the power model, it may be provided that the use of the power model includes at least an integration of a predicted power demand progression over one, or the, scan time of the scan protocol.

With regard to the predictive projection regarding the activity of a gradient system, in the prior art, different modelling approaches have already been proposed in relation to cooling facilities of magnetic resonance facilities, which may also be utilized in the context of the present embodiments. For example, state parameter models, within which scan protocols and magnetic resonance sequences may be rolled out in order to simulate corresponding effect on the state parameters in order, for example, to be able to estimate how long a magnetic resonance facility may be operated at a particular power level before the operating limit of a cooling facility is reached, have been provided. Such approaches of rolling out scan protocols may also be used accordingly in the context of the present embodiments.

Therein, a development of the present embodiments provides that the control facility is configured for using the simulation also for controlling a cooling facility and/or for temperature management of at least one component of the magnetic resonance facility. This provides, therefore, that for different control tasks, a common simulation and, for example, also a common power model may be applied so that, for example, on the basis of the calculation results, both the power management described and also a cooling management and/or temperature management may be carried out. This centralizes control processes of the magnetic resonance facility and simplifies the control processes overall as well as placing fewer demands on realization. Therein, the power model and the simulation may be implemented by the aforementioned control arrangement of the magnetic resonance facility as part of the control facility.

As already mentioned, different functions from the energy store (e.g., in the case of a UPS facility, to continue to use the UPS facility as an uninterruptible power supply via the network connection on a failure of the network supply) may be realized. In this event, a certain prioritizing of functions may take place, once it appears, for example, to be less suitable to carry out a particularly power-intensive magnetic resonance sequence and/or a particularly power-intensive scan protocol if a power failure has occurred and, for example, a cooling facility for the main magnet is to be fed from the energy store and/or overall a certain basic functionality/basic operational readiness of the magnetic resonance facility is to be maintained despite the power failure. In concrete terms, it may be provided, for example, that the control facility is configured for preventing the performance of scan protocols exceeding an energy requirement threshold and/or a power demand threshold in the event of the failure of the network supply via the network connection. It is thus provided that for as long a time period as possible, an emergency supply function may be maintained and/or that too strong a discharging of the energy store may be prevented.

In general, in an embodiment, it may be provided that the control facility is configured, in the event of a failure of the network supply via the network connection, for use of the electrical energy stored in the energy store for at least one further function of the magnetic resonance facility. In specific terms, the at least one function may be selected from the group including a cooling function of a cooling facility for a main magnet cooled without the use of helium (e.g., therefore a dry magnet) and a basic operational readiness function for maintaining the basic operational readiness of the magnetic resonance facility. For example, it is suitable to use the energy store only for the corresponding emergency supply and, as described, to suppress the performance of excessively power-intensive and energy-intensive scan protocols (e.g., with corresponding notification to a user). In general, a network failure may be established, for example, on use of a UPS facility by a control unit of the UPS facility and may be communicated to a control arrangement of the magnetic resonance facility, as previously indicated.

The power supply facility including, for example, a UPS facility may therefore ultimately be accessed often for different application cases and therefore not only to enhance the installed power with output power from the energy store, but additionally also as an emergency supply in different operating states which are selectable, for example, dependent upon a charge state of the energy store. Thus, for example, in a high charge state of the energy store, the basic operational readiness may be selected, which also includes a further cooling by the cooling facility of the main magnet; otherwise, given a low charge state of the energy store, only the cooling of the main magnet may be maintained, and therefore, other systems may be deactivated. Intermediate states are also conceivable and fundamentally implementable as a corresponding function.

In this context, a development of the present embodiments provides that the control facility is configured for using an account model for the different functions in which an energy account at energy buffers of the energy store to be made available for this function is associated with each function. In a configuration using the feasibility criterion, the feasibility criterion takes account of the energy accounts. The energy buffer as part of the storage capacity of the energy store substantially specifies for a function (e.g., under normal operational conditions) for which time period the function may or should be at least maintained. The energy buffer of each energy account in the account model therefore ultimately represents a proportion of the storage capacity of the energy store that is reserved for the corresponding function and is provided at least for a predetermined time period. For example, the account model may be configured so that the account model divides the energy store into different energy accounts (e.g., an energy account for use by power-intensive scan protocols, an energy account for the cooling of the main magnet in the event of a power failure (e.g., magnet cooling buffer), and an energy account for a minimum time period in which the magnetic resonance facility may be further operated in the event of a power failure (e.g., system running buffer)). In this way, it can be provided that, for example, the UPS facility still has an energy buffer available in case of intensive use by power-intensive scan protocols in the event of a power failure.

In a specific embodiment, it may also be provided therein that the feasibility criterion has a result case of conditional feasibility by disregarding one or more of the at least one energy accounts. The control facility is configured, in a case of conditional feasibility, to request an execution instruction while outputting an energy account infringement information item in this regard to a user. This provides that embodiments that are alternatively also implementable via the previously discussed warning condition, in which an energy account may be infringed on instruction by the user in order to offer to the user the greatest possible decision-making freedom, may be provided. The user, however, is expressly notified about the consequences (e.g., an emergency supply that is no longer present on a failure of the network supply).

A development making use of such an account model provides that the control facility is configured for evaluating at least one user input for adapting the energy buffer of at least one energy account. This provides, in specific terms, that the time periods for which the function may be at least executable and/or the energy buffers may be configured parameterizable and/or settable by a service technician and/or a user. This is helpful to the effect that the size of the energy store (e.g. a storage capacity) may vary for different magnetic resonance systems and since different users possibly pursue different aims with the power supply facility. In this way, therefore, a configuration capability is provided with regard to the multi-usability of the power supply facility (e.g., the energy store/the UPS facility).

In a further development of the present embodiments, the control facility may be configured, during an examination of a patient including a plurality of scan protocols in a predetermined sequence, and in the event of non-feasibility of at least one of the scan protocols for renewed checking of the feasibility with a changed sequence and, for example, after a confirmation by a user, to use the changed sequence. This provides that an analysis with regard to the feasibility may also take place over a plurality of scan protocols (e.g., if the plurality of scan protocols are part of an examination of a particular patient). If, for example, anatomical and functional magnetic resonance datasets are recorded for a patient using a plurality of corresponding scan protocols, it may arise that the functional scans have a higher energy requirement and also exceed the installed power in corresponding power demand, so that on early execution, the charge state of the energy store is possibly not yet sufficient. According to the present embodiments, it may be estimated how strongly the energy store is chargeable during other scan protocols in order to enable, where relevant, the whole examination if, for example, a scan protocol with a high energy requirement is placed at the end of the examination. Comparable approaches may also be implemented if in another context, a sequence of scan protocols over a relatively long time period is defined in advance.

Finally, it may also be suitable with respect to the power supply facility if the control facility is configured to take into account at least one item of network information describing the network supply via the network connection (e.g., a current loadability of the power network) for the provision of power to the magnetic resonance facility. If, for example, the maximum installed power is not accessible from the power network, it may be necessary, even at low power demands of the magnetic resonance facility, to access the energy store while the quality of the electrical power from the power network may also be taken into account even during charging processes and the like.

For charging the energy store, the power supply facility may also include, for example, within the relevant UPS facility, a charging device that may be actuated by a control unit of the UPS facility. When the energy store is not fully charged and the magnetic resonance facility demands less than the installed power, the charging device may always charge the energy store accordingly.

Aside from the power supply facility, the present embodiments also relate to a magnetic resonance system having at least one magnetic resonance facility and at least one power supply facility according to the present embodiments. All the statements regarding the power supply facility according to the present embodiments apply also to the magnetic resonance system according to the present embodiments.

For example, this provides that an energy store and a network connection (e.g., a UPS facility) may also be used for a plurality of magnetic resonance facilities. In one embodiment, a first number of energy stores with an associated network connection (e.g., therefore UPS facilities) supply a second number of magnetic resonance facilities. It may therefore be provided that the magnetic resonance system includes a plurality of magnetic resonance facilities and/or a plurality of electrical energy stores (e.g., in different uninterruptible power supply facilities). It is herein suitable if the control facility includes a master unit coordinating the demands of the plurality of magnetic resonance facilities and/or allocating energy stores to power demands. The master unit includes or is a control arrangement, one of the magnetic resonance facilities, and/or a control unit of one of the energy stores and/or an additional computer apparatus. Such a master unit, if provided, may also administer an account model and is generally provided for resolving demands of the at least one magnetic resonance facility. Given a plurality of magnetic resonance facilities, these communicate corresponding energy requirements from the at least one energy store between one another. The master unit is then to communicate accordingly whether the demands may be met. For this purpose, the master unit may have, for example, access to an arbitration rule set in the event of competing demands. The master unit may be formed by the control arrangement of a magnetic resonance facility, where it is also conceivable that for this purpose, the control facility has an additional computer facility external to the magnetic resonance facility.

The present embodiments also relate to a method for operating a power supply facility of at least one magnetic resonance facility for supplying the magnetic resonance facility with electrical power. The power supply facility has a control facility, a network connection to a power network, and an electrical energy store (e.g., a battery). According to the present embodiments, a network connection that is configured for an installed power that is lower than a maximum power demandable by the magnetic resonance facility is used as the network connection. The control facility provides electrical power, in the event that a power demand of the magnetic resonance facility exceeds the installed power, from the network connection and the energy store. All the disclosures relating to the power supply facility and the magnetic resonance facility according to the present embodiments may be transferred similarly to the method according to the present embodiments, so that the corresponding advantages may also be achieved. This applies, for example, also to the embodiments regarding the use of a power model and a feasibility criterion, and to the use of an account model.

DETAILED DESCRIPTION

Figure 1:
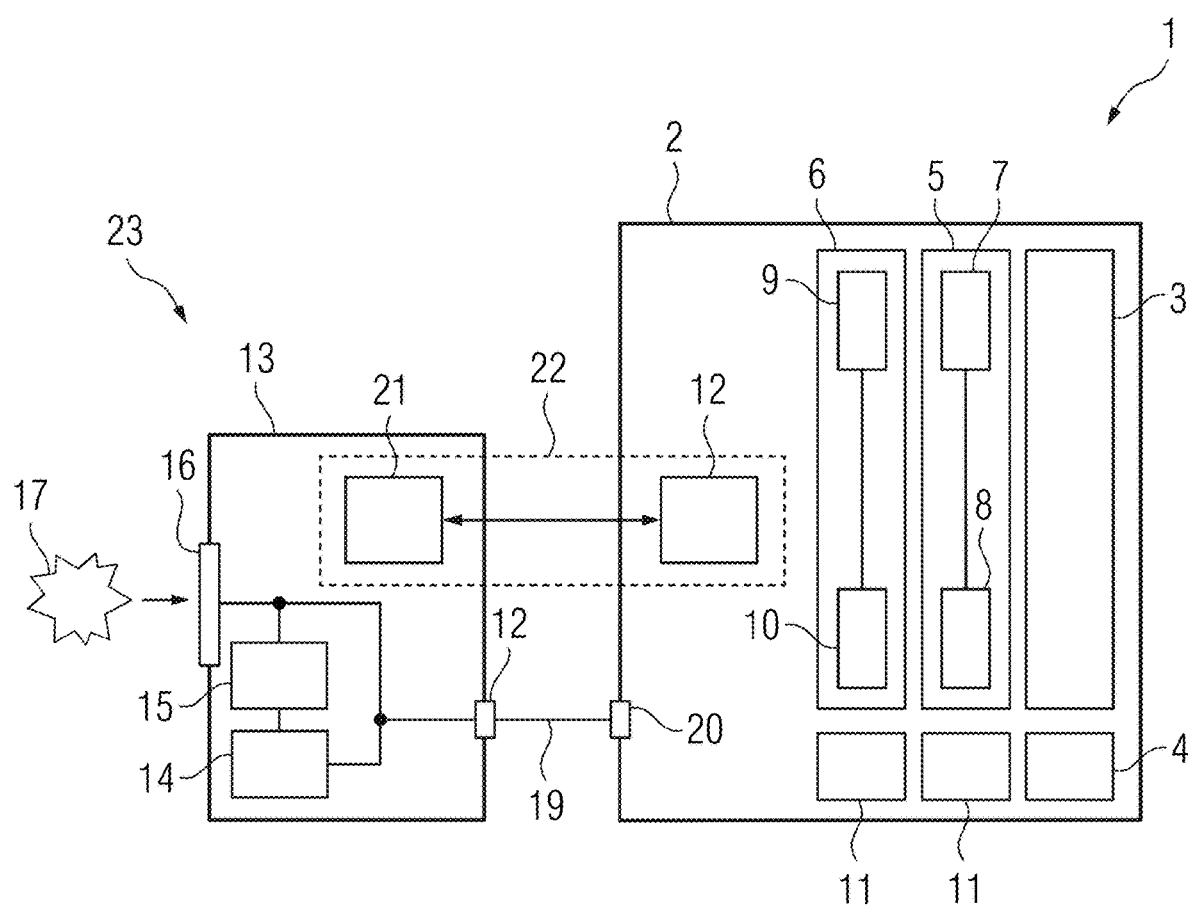
FIG. 1 is a first exemplary embodiment of a magnetic resonance system.

FIG. 1 shows a sketch of the principle of a magnetic resonance system 1 according to an embodiment. In the present case, this includes a magnetic resonance facility 2 (e.g., a magnetic resonance device) that is shown only schematically here. As is known in principle, the magnetic resonance facility 2 has a main magnet 3 for generating the main magnetic field that, in the present case, has a strength of less than 1.5 T (e.g., 0.35 T) and is "dry", which provides that the cooling facility 4 associated with the main magnet 3 does not use any helium in the present case.

The magnetic resonance facility 2 further includes a gradient system 5 and a transmitter system 6 (e.g., radio frequency system). The gradient system 5 has a gradient coil arrangement 7 that is fed by a gradient power amplifier 8. Accordingly, the transmitter system 6 includes a radio frequency coil arrangement 9 and a radio frequency power amplifier 10. Cooling facilities 11 (e.g., cooling devices) may also be associated both with the gradient system 5 and also the transmitter system 6.

The operation of the magnetic resonance facility 2 is controlled by a control arrangement 12.

The magnetic resonance system 1 further includes, for example, an uninterruptible power supply (UPS) facility 13 (e.g., a UPS device) that, as is known in principle, has an energy store 14 with an associated charging device 15. Further electronic components (e.g., switching facilities and the like) are not shown for the sake of clarity. The UPS facility 13 has a network connection 16 for connecting to a power network 17 (shown only schematically) and an output terminal 18 that is connected via a connection 19 to an input terminal 20 of the magnetic resonance facility 2. The operation of the UPS facility 13 is controlled by a control unit 21 (e.g., a controller, including one or more processors). In the present case, the control unit 21 and the control arrangement 12 form a control facility 22 (e.g., a control device) of a power supply facility 23 (e.g., a power supply device) according to the present embodiments, which, aside from the control facility 22, also includes the further components of the UPS facility 13.

For the performance of different scan protocols with at least one magnetic resonance sequence in each case, the magnetic resonance facility 2 uses a certain electrical power level to be demanded that, in the following, is to be designated the power demand of the magnetic resonance facility 2. For this power demand, there exists a maximum (e.g., a demandable maximum power level) that arises for the most power-intensive scan protocol (e.g., an EPI diffusion scan). Whereas previously the network connection 16 has been configured for this maximum power level, the network connection 16 is configured in the present case such that an installed power (e.g., the maximum power that is drawable from the power network 17) is less than the maximum power level. For this purpose, the control facility 22 is configured, in the event of a power demand by the magnetic resonance facility 2, to access the difference from the installed power from the energy store 14 (e.g., a battery). This provides that with particularly power-intensive scan protocols, in addition to the installed power drawable from the power network 17 via the network connection 16, the energy store 14 is also loaded. Whenever the power demand is lower than the installed power, the control facility 22 uses the charging device 15 to recharge the energy store 14.

Generally speaking, the components of the power supply facility 23 are dimensioned and/or configured so that in normal operation (e.g., during normal use of the magnetic resonance facility 2), no restrictions are set by the installed power 16 relative to the maximum power. A normal operation may be, for example, that power-intensive scan protocols that therefore require the energy store 14 and less power-intensive scan protocols, the power demand of which is lower than the installed power, alternate with corresponding scan pauses. For example, it may be assumed that a certain protocol combination occurs within a particular time period (e.g., one power-intensive scan protocol per hour or the like). A reference group containing less power-intensive scan protocols, for which, for example, a worst case scenario and/or a mean power demand may be determined, from which a suitable installed power of the network connection 16 may be derived, may be defined. As far as the storage capacity of the energy store 14 is concerned, in the present case, at least one further function may also be provided by the UPS facility 13 for an emergency supply in the event of a power failure and therefore a failure of the network supply from the power network 17. Therein, for example, two different operating modes may, for example, be defined: a pure maintenance of the cooling of the main magnet 3 and therefore a continuing operation of the cooling facility 4; and/or the provision of a basic operational readiness of the magnetic resonance facility 2, and therefore, for example, an operational state in which only few power-intensive scan protocols of the reference group are to be used. As described in greater detail below, in an account model, an energy account with a particular energy buffer may be assigned to these functions in order to reserve particular portions of the storage capacity of the energy store 14 for these functions.

Therefore, for the dimensioning of the energy store 14 (e.g., for specifying a corresponding storage capacity), the energy buffers and the strength of the desire for the use of power-intensive scan protocols are to be taken into account. For example, the energy store 14 may be dimensioned so that at least one operational state relating, for example, to one of the functions may be maintained for a particular time period, and therefore, the energy buffer of the energy account is present and additionally, for a particular time period (e.g., the most power-intensive scan protocol may be carried out by enhancing the installed power). The predetermined time period relating to the most power-intensive scan protocol, where, for example, the most energy requirement-intensive scan protocol, the power requirement of which at least temporarily exceeds the installed power, may be taken into account, may amount, for example, to 5 to 60 minutes. Similar time periods may also be used in the dimensioning of the energy buffers.

By relevant investigations, it has been found that suitably the installed power may amount to 50% to 90% (e.g., 60% to 80%) of the maximum power, and/or the storage capacity of the energy store 14 may amount to at least 5 kWh (e.g., at least 10 kWh). The output power of the energy store 14 is defined, for example, as at least the difference between the maximum power and the installed power.

In suitable exemplary embodiments, apart from the energy store 14 configured as a battery, additionally or alternatively, at least one further energy store 14 (not shown for the sake of clarity), which is distinguished by faster charging times than the energy store 14, may also be used in order to be able to provide at least a proportion of the overall storage capacity again as quickly as possible. Such a further energy store may be, for example, a supercapacitor (e.g., supercap).

Figure 2:
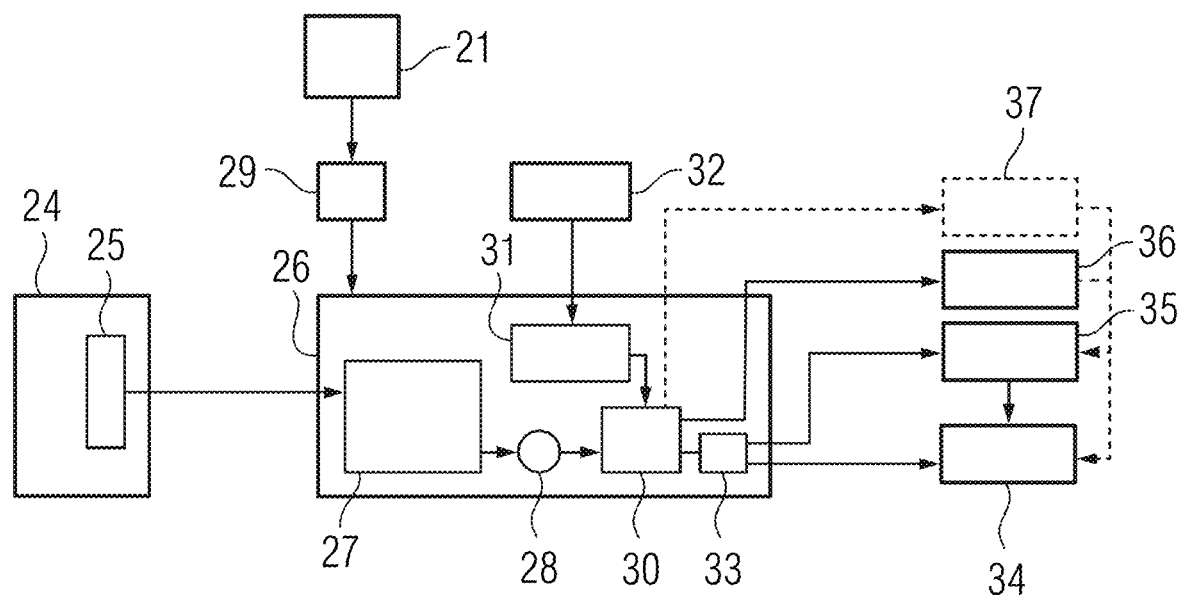
FIG. 2 is a sketch of functional relationships of an exemplary embodiment of the method.

FIG. 2 illustrates an exemplary embodiment of the method for operating the power supply facility 23, in a functional sketch, specifically relating to the case of the selection of a scan protocol to be carried out in a scan protocol preparation unit 24.

The protocol data 25 defining the selected scan protocol including, for example, recording parameters of the scan protocol are passed on to an energy management system 26. There, using a power model 27, it is to be ascertained at least for scan protocols in which at least sometimes the power demand exceeds the installed power, what energy requirement 28 (e.g., as an energy requirement from the energy store 14) is to be expected. Therein, different configurations of the power model 27 in the control facility 22 (e.g., in the control arrangement 12) may be provided.

In a first specific configuration, different scan protocols and/or scan protocol groups and/or magnetic resonance sequences and/or magnetic resonance sequence groups (e.g., in a look-up table) may be associated with power requirement values. Such power requirement values relate, for example, to the radio frequency system 6 (optional) and/or the gradient system 5, so that the power requirement values may then be designated the radio frequency requirement value and the gradient requirement value accordingly. At the same time, for all scan protocols and/or magnetic resonance sequences, the same basic requirement value is available as the power requirement value, which naturally may be broken down in other exemplary embodiments according to scan protocols/magnetic resonance sequences/groups. Since the protocol data 25 also contains a scan time, by multiplication of the sum of the power values by the scan time, an energy requirement 28 may be easily established.

In one embodiment, however, in the context of the preceding power model 27 in the context of a simulation, at least one part of the scan protocol may be rolled out (e.g., with regard to the gradient system 5). Approaches with which this is possible have been provided in the prior art with regard, for example, to the cooling management, which therefore likewise has access in the context of this exemplary embodiment to the power model 27 that may also apply for another more general temperature management. This provides that at least one part of the results of the power model 27 (e.g., the simulation used, such as in relation to the gradient system 5) are also used for the cooling management and/or the temperature management, so that an advantageous multi-use synergy effect comes about. Herein, the energy requirement estimate (e.g., for electrical energy needed from the energy store 14) may be as accurate as desired in the context of the simulation, but may be obtained as a temporal integration over a temporal power demand progression (e.g., after subtraction of the installed power) in order to obtain the electrical energy needed from the energy store 14.

The energy requirement 28 is evaluated, together with the charge state of the energy store 14 that is transmitted cyclically by the control unit 21 according to act 29, by a feasibility criterion 30. The feasibility criterion 30 checks whether, on the basis of the current charge state and the energy requirement 28 of the selected scan protocol, a performance is possible. Without taking account of the account model 31 that is still to be discussed, if the energy requirement 28 already corresponds to the energy requirement from the energy store 14, this would provide that the charge state is compared with the energy requirement 28.

In the present case, however, the account model 31 is still present, which contains, for the described cooling function (e.g., operation of the cooling facility 4 during a power failure) and the basic operational readiness function (e.g., maintenance of the basic operational readiness of the magnetic resonance facility 2), energy accounts that each define a particular energy buffer and therefore a reserved portion of the storage capacity of the energy store 14 for the respective function. Since this buffer is fundamentally to be reserved for a failure of the network supply via the power network 17, the feasibility criterion 30 may take account adequately of the respective energy buffer, for example, by subtraction from the charge state of the energy store 14 before the performance of the comparison with the energy requirement 28.

As is shown in FIG. 2 herein, it is possible to adapt the energy accounts (e.g., the energy buffers) dependent upon a user input 32. In this way, a service technician or even a user may influence the configuration and, for example, activate/deactivate particular functions and/or configure the particular functions according to wishes of the service technician or the user (e.g., with regard to the operating duration).

The feasibility criterion 30 has at least two possible results, including "feasible" and "not feasible". In the case of feasibility, a warning condition 33 is also checked. The warning condition 33 may compare, for example, the residual charge state after performance of the scan protocol to be carried out with a threshold value for the residual charge state and may be met in the case of an undershoot or may also be met if for at least one function (e.g., on the basis of the user input 32), an at least partial use of the respective energy buffer is permitted and the energy buffer is partially utilized. Without fulfilment of the warning condition, without further output to the user, the selected scan protocol is used in act 34. If, however, the warning condition is met, in act 35, a warning that gives the corresponding reason for the fulfilment of the warning condition is output. Here, only after a confirmatory input by the user does the process continue at act 34; if the user does not make confirmation, the process is terminated.

If the feasibility criterion is not met, in a corresponding act 36, various possibilities exist. The performance of the scan protocol is initially refused in order to prevent a termination based on a lack of electrical power. A corresponding item of information is output to the user.

In addition, an item of additional information may be established. The item of additional information may include, for example, how long it is necessary to wait until the energy store 14 is sufficiently charged again in order, nevertheless, to carry out the scan protocol. However, an item of adaptation information may be determined, for example, using the power model 27, for at least one recording parameter of the scan protocol that may have been contained in the protocol data 25 (e.g., such that after the adaptation of the recording parameter according to the adaptation of the adaptation information, the scan protocol may be carried out with the current charge state). Herein also, for example, a confirmation by the user may be obtained before the adaptation information is used.

If the waiting time has expired or if the adaptation information has been successfully established and used, the process may be continued again, possibly after a check of the warning condition 33, at act 34 or act 35.

In an optional embodiment, the feasibility criterion 30 may also output a third output value, specifically "conditionally feasible". Conditional feasibility provides that at least one energy buffer according to the account model 31 would have to be infringed in order to carry out the selected scan protocol. This may be confirmed according to a corresponding item of information from the user in act 37. This provides that the user is given the possibility of transferring, at least via exception, the specifications of the account model 31, for example, if the scan is of utmost importance. After a corresponding confirmation by the user, possibly taking account of the warning condition 33, it is possible to continue with one of the acts 34 or 35 in order to perform the scan protocol. If no confirmation is given, the process is stopped and the user may select, for example, a new scan protocol.

During performance of the scan protocol in act 34, the control facility 22 uses, as described, the installed power of the network connection and additional power from the energy store 14 in order to provide the power demand for the selected scan protocol.

If the magnetic resonance facility 2 is not in operation (e.g., scan pause) and during the use of scan protocols the power demand undershoots the installed power, the energy store 14 may be charged again accordingly.

Figure 3:
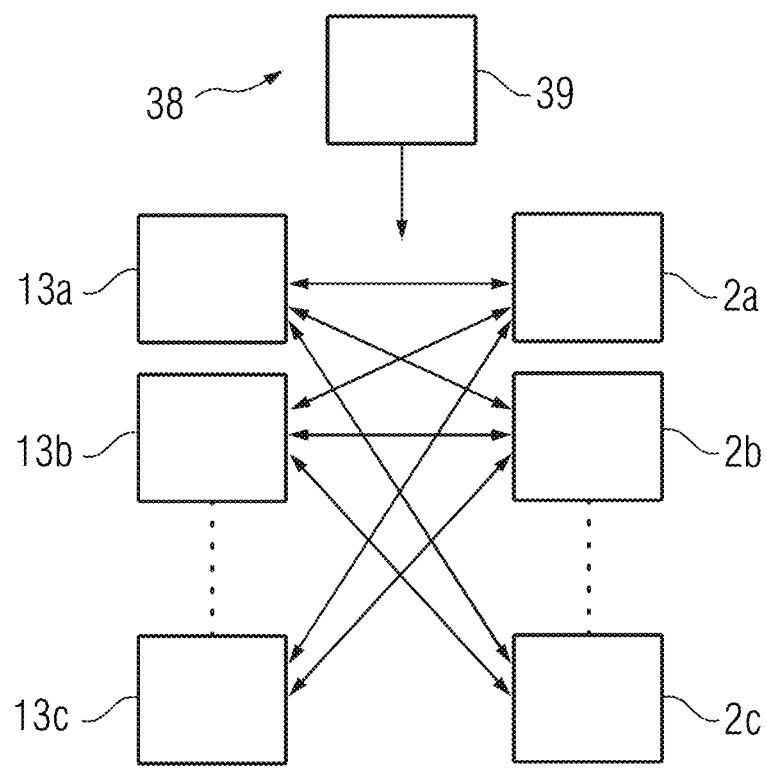
FIG. 3 is a second exemplary embodiment of a magnetic resonance system.

Finally, FIG. 3 shows a second exemplary embodiment of a magnetic resonance system 1' according to the present embodiments. In this case, the magnetic resonance system 1' includes a first number of magnetic resonance facilities 2a, 2b, 2c and a second number of UPS facilities 13a, 13b, 13c. In order to organize and/or coordinate demands of the magnetic resonance facilities and the divisions of power and possibly to arbitrate according to a set of arbitration rules, the control facility has a master unit 38 that may be realized as one of the control arrangements 12 of the magnetic resonance facilities 2a, 2b, 2c, but in the present case, is realized as an additional magnetic resonance facility-external and UPS-external computer facility 39.

Although the invention has been illustrated and described in detail with the exemplary embodiments, the invention is not restricted by the examples disclosed, and other variations may be derived therefrom by a person skilled in the art without departing from the protective scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A power supply facility for supplying a magnetic resonance facility with electrical power, the power supply facility comprising:
a control facility; and
a network connection to a power network and an electrical energy store,
wherein the network connection is configured for an installed power level that is lower than a maximum power level that is demandable by the magnetic resonance facility,
wherein the control facility is configured, in the event that a power demand of the magnetic resonance facility exceeds the installed power, to provide the power from the network connection and the energy store, wherein the control facility is further configured for using the electrical energy stored in the energy store for at least one further function of the magnetic resonance facility in the event of a failure of the network supply via the network connection, wherein the control facility is further configured for using an account model for different functions in which an energy account at energy buffers of the energy store to be made available for this function is associated with each function, wherein the account model is configured to divide the energy store into different energy accounts, and wherein a feasibility criterion takes account of the energy accounts.

2. The power supply facility of claim 1, wherein the electrical energy store is a battery.

3. The power supply facility of claim 1, wherein the network connection and the electrical energy store are part of an uninterruptible power supply facility that is connected via an electric connection to the magnetic resonance facility.

4. The power supply facility of claim 1, wherein the installed power of the network connection is 50% to 90% of the maximum power demandable by the magnetic resonance facility, the storage capacity of the energy store is at least 5 kWh, the storage capacity of the energy store is selected to maintain at least an operational state of the magnetic resonance facility for at least a specified time period, the installed power of the network connection is selected as a statistical mean power demand of the magnetic resonance facility in image recording operation or dependent upon the statistical mean power demand or as a maximum power demand of a reference group of scan protocols, magnetic resonance sequences classified as less power-intensive, or a combination thereof, or any combination thereof.

5. The power supply facility of claim 4, wherein the installed power of the network connection is 60% to 80% of the maximum power demandable by the magnetic resonance facility.

6. The power supply facility of claim 4, wherein the storage capacity of the energy store is at least 10 kWh.

7. The power supply facility of claim 1, wherein the control facility is configured, on selection of a scan protocol to be carried out using a magnetic resonance sequence, to:

predict an energy requirement for performance of the scan protocol using a power model; and evaluate a feasibility criterion that evaluates a current charge state and the predicted energy requirement, and indicates a feasibility of the scan protocol, wherein when non-feasibility is indicated, a notification is output to a user and the execution of the scan protocol is suppressed.

8. The power supply facility of claim 7, wherein:

the control facility is further configured, given the existence of the feasibility criterion indicating the feasibility and when a warning condition that indicates a residual charge state falling below a threshold value is met, a restriction of at least one further function to be supplied from the energy store is met, or a combination thereof, to output a warning indicating this circumstance to the user and request a confirmation by the user before the performance of the scan protocol;

the control facility is further configured, in the event of a feasibility criterion indicating the non-feasibility, for establishing and outputting at least one item of additional information until the feasibility, for establishing for at least one recording parameter of the scan protocol such that the scan protocol is executable, or a combination thereof; or a combination thereof.

9. The power supply facility of claim 8, wherein the at least one item of additional information includes a waiting time.

10. The power supply facility of claim 7, wherein the use of the power model comprises the establishment of at least one power requirement value that is associated with the scan protocol to be carried out, the magnetic resonance sequence, or a combination thereof, and the prediction of the energy requirement by multiplication of the at least one power requirement value by a scan time of the scan protocol.

11. The power supply facility of claim 10, wherein the at least one power requirement value is selected from a group consisting of a basic requirement value for the operation of the magnetic resonance facility, a gradient requirement value for a gradient system of the magnetic resonance facility, and a radio frequency requirement value for a transmitter system of the magnetic resonance facility.

12. The power supply facility of claim 7, wherein the use of the power model in the context of a predictive projection of at least one partial energy requirement related to at least one component of the magnetic resonance facility comprises a simulation of at least one part of the scan protocol.

13. The power supply facility of claim 12, wherein the control facility is further configured for using the simulation also for controlling a cooling facility, for temperature management of at least the components of the magnetic resonance facility, or for a combination thereof.

14. The power supply facility of claim 1, wherein the control facility is further configured for preventing the performance of scan protocols exceeding an energy requirement threshold, a power demand threshold, or a combination thereof in the event of the failure of the network supply via the network connection.

15. The power supply facility of claim 1, wherein the at least one function is selectable from the group consisting of a cooling function of a cooling facility for a main magnet cooled without the use of helium and a basic operational readiness function for maintaining basic operational readiness of the magnetic resonance facility.

16. The power supply facility of claim 1, wherein the different energy accounts include a first energy account for use by power-intensive scan protocols, a second energy account for cooling a magnet in the event of a power failure, and a third energy account for a minimum time period in which the magnetic resonance facility may be further operated in the event of the power failure.

17. A magnetic resonance system comprising:

at least one magnetic resonance facility; and at least one power supply facility, a power supply facility of the at least one power supply facility being for supplying the at least one magnetic resonance facility with electrical power, the power supply facility comprising:

a control facility; and a network connection to a power network and an electrical energy store, wherein the network connection is configured for an installed power level that is lower than a maximum power level that is demandable by the magnetic resonance facility, wherein the control facility is configured, in the event that a power demand of the magnetic resonance facility exceeds the installed power, to provide the power from the network connection and the energy store, wherein the control facility is further configured for using the electrical energy stored in the energy store for at least one further function of the magnetic resonance facility in the event of a failure of the network supply via the network connection, wherein the control facility is further configured for using an account model for different functions in which an energy account at energy buffers of the energy store to be made available for this function is associated with each function, wherein the account model is configured to divide the energy store into different energy accounts, and wherein a feasibility criterion takes account of the energy accounts.

18. The magnetic resonance system of claim 17, wherein the at least one magnetic resonance facility comprises a plurality of magnetic resonance facilities, the magnetic resonance system further comprises a plurality of electrical energy stores, or a combination thereof, and wherein the control facility comprises a master unit configured to coordinate demands of the plurality of magnetic resonance facilities, assign the plurality of energy stores to power demands, or a combination thereof, the master unit comprising or being a control arrangement of one magnetic resonance facility of the plurality of magnetic resonance facilities, a control unit of one energy store of the plurality of energy stores, an additional computer facility, or any combination thereof.

19. A method for operating a power supply facility of at least one magnetic resonance facility for supplying the at least one magnetic resonance facility with electrical power, wherein the power supply facility comprises a control facility, a network connection to a power network, and an electrical energy store, wherein as the network connection, a network connection that is configured for an installed power level that is lower than a maximum power level that is demandable by the at least one magnetic resonance facility is used, the method comprising:

providing, by the control facility, electrical power from the network connection and the energy store in the event that a power demand by the at least one magnetic resonance facility exceeds the installed power;

using, by the control facility, an account model for different functions in which an energy account at energy buffers of the energy store to be made available for these functions are associated with each function;

dividing, by the account model, the energy store into different energy accounts; and taking account, by a feasibility criterion, of the energy accounts.

* * * * *